United States Patent [19]

Kuwabara

[11] Patent Number: 5,066,973
[45] Date of Patent: Nov. 19, 1991

[54] IMAGE FORMING APPARATUS USING AN ELONGATED WEB-LIKE RECORDING MEDIUM

[75] Inventor: Satoru Kuwabara, Chiryu, Japan
[73] Assignee: Brother Kogyo Kabushiki Kaisha, Nagoya, Japan
[21] Appl. No.: 614,235
[22] Filed: Nov. 16, 1990

[30] Foreign Application Priority Data

Feb. 13, 1990 [JP] Japan .................................. 2-31942

[51] Int. Cl.⁵ .............................................. G03B 27/52
[52] U.S. Cl. ........................................ 355/27; 355/41; 355/72
[58] Field of Search .................. 355/27, 40, 41, 72, 355/100, 106; 354/21, 105–109

[56] References Cited

U.S. PATENT DOCUMENTS

| | | | |
|---|---|---|---|
| 3,276,340 | 10/1966 | Nerwin | 352/78 C |
| 3,490,348 | 1/1970 | Ariyasu et al. | 352/78 C |
| 4,399,209 | 8/1983 | Sanders | 430/138 |
| 4,494,862 | 1/1985 | Tanaka | 355/40 |
| 4,714,943 | 12/1987 | Sakakibara et al. | 355/27 |
| 4,982,224 | 1/1991 | Yamamoto et al. | 355/27 |

FOREIGN PATENT DOCUMENTS 2211631A 7/1989 United Kingdom .

*Primary Examiner*—L. T. Hix
*Assistant Examiner*—D. Rutledge
*Attorney, Agent, or Firm*—Oliff & Berridge

[57] ABSTRACT

An image forming apparatus that provides consistent images on an elongated web-like recording medium. The image forming apparatus forms the image on the recording medium as it is supplied from a supply member and passes across an exposure station. An associated winding member is detachably installed in the apparatus to take up the recording medium supplied from the supply member. Placed on the winding member are indicia containing information on the exposure and developing characteristics of the recording medium. The operation of the image forming apparatus is controlled according to the characteristics information that is read by a reading device prior to the attachment of a leading edge of the recording medium to the winding member during the automatic feed of the recording medium.

16 Claims, 3 Drawing Sheets

IMAGE FORMING APPARATUS USING AN ELONGATED WEB-LIKE RECORDING MEDIUM

BACKGROUND OF THE INVENTION

1. Field of the Invention

The present invention relates to an image forming apparatus, and more particularly, to an image forming apparatus for automatically controlling the image forming conditions according to the exposure and development characteristics of the recording medium.

2. Description of Related Art

An image forming apparatus for forming an image on a developer member, in which pressure development is executed by overlapping and subjecting the exposed photosensitive medium and the developer member to pressure is known. The photosensitive recording medium used in such an image forming apparatus has various photosensitivity and development characteristics as a result of the manufacturing process and the material used. As a result, the optimum conditions for exposing and developing the copied image are different for each photosensitive recording medium and the user must input the specified optimum conditions to the image forming apparatus prior to starting the image forming process. However, in the known image forming apparatus discussed above, the user must manually input the information associated with exposure and developing conditions. Therefore, there are problems in that the operation is very complex, requiring special controls, and an input mistake can prevent formation of an optimum image.

An image forming apparatus has been proposed in GB2211631A to solve such problems. According to the disclosed image forming apparatus, an information mark, such as a bar code, providing the exposure and developing conditions for the photosensitive medium are formed on a leading portion of the photosensitive recording medium. The information mark is read in the image forming apparatus and the image forming conditions are automatically set according to the information.

According to such an image forming apparatus, the information mark, such as the bar code, formed on the leading portion of the photosensitive recording medium is read during the automatic feeding of the recording medium. However, when the photosensitive recording medium is fed automatically, the leading portion of the photosensitive recording medium has an inherently unstable leading free edge. Because of this, it was necessary for the reading device to have a guiding mechanism to reduce the instability of the leading edge of the sheet containing the information mark. Still, reading focus is sufficiently unstable that the reading errors may result.

SUMMARY OF THE INVENTION

It is therefore the object of the present invention to provide an image forming apparatus of simple structure that provides a stable image of the information mark, containing characteristics of the photosensitive recording medium, that is easily read.

According to the present invention, there is provided an image forming apparatus for recording an image by using an elongated web-like recording medium, comprising: a supply member on which the recording medium is wound; an image forming means for forming an image on the recording medium supplied from the supply member; a winding member detachably installed in the apparatus to wind the recording medium supplied from the supply member wherein the winding member includes information on the exposure and development characteristics of the recording medium; reading means for reading the characteristics information; and a control means for controlling the image forming means according to the characteristics information read by the reading means.

BRIEF DESCRIPTION OF THE DRAWINGS

The above and other objects, features and advantages of the present invention will become more apparent from reading the following description of the preferred embodiment taken in connection with the accompanying drawings in which.

DETAILED DESCRIPTION OF THE PREFERRED EMBODIMENT

Hereinafter, an embodiment which embodies the present invention will be explained with reference to FIGS. 1 through 3.

Figure 1:
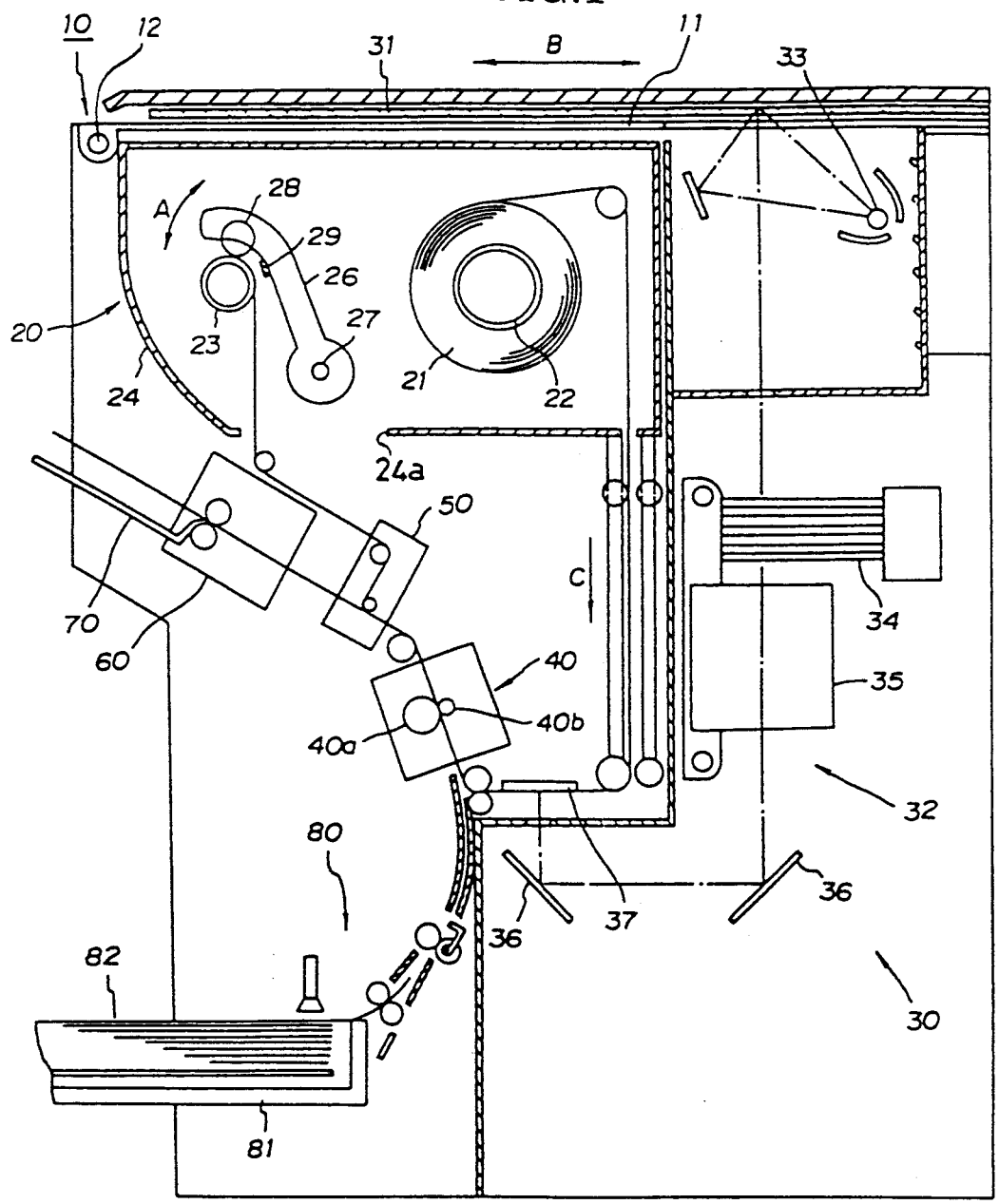
FIG. 1 shows an image forming apparatus according to an embodiment of the present invention.

FIG. 1 shows image forming apparatus 10 embodying the present invention. The image forming apparatus 10 comprises a photosensitive recording medium unit 20 for transporting a photosensitive recording medium 21, an exposing device 30 for exposing the photosensitive recording medium 21 based on an original, a pressure developing device 40 for applying pressure to an exposed photosensitive recording medium 21 and a developer sheet 82 held in facing contact with each other to develop an image on the developer sheet 82, and a thermal fixing device 60 for fixing the image developed on the developer sheet 82.

Figure 2:
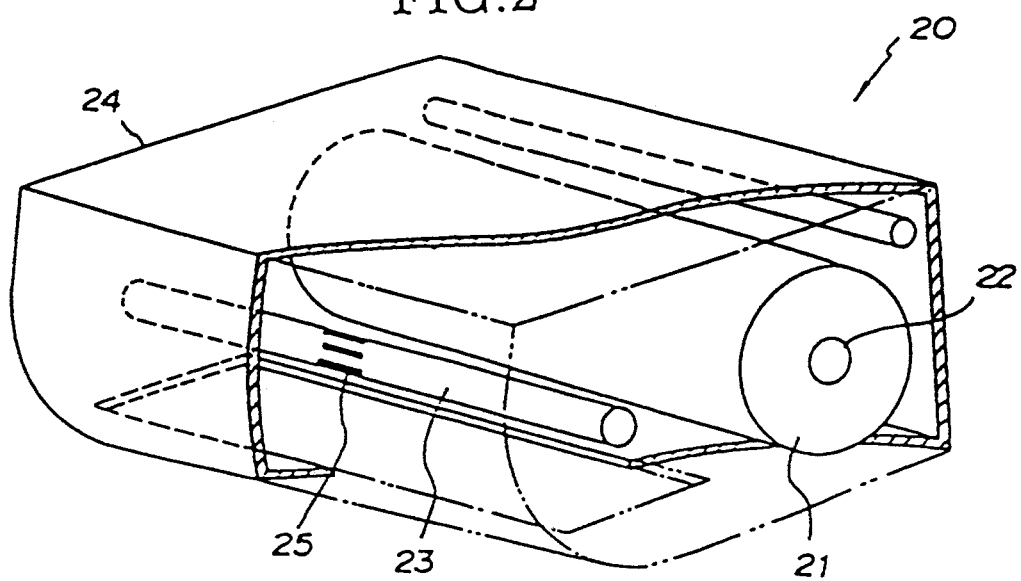
FIG. 2 is a partial sectional perspective view of a recording medium unit for the image forming apparatus.
Figure 3:
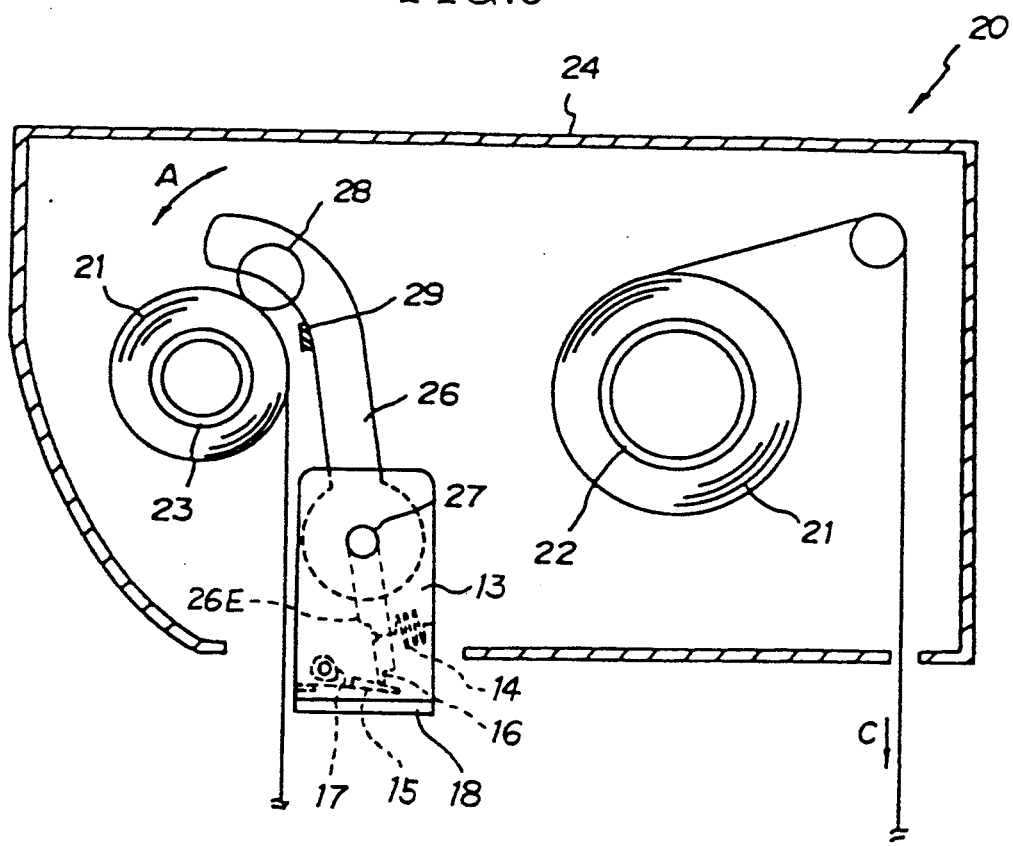
FIG. 3 is an enlarged sectional view of the recording medium unit.

As shown in FIGS. 1 through 3, the photosensitive recording medium unit 20 comprises a supply roller 22, on which the microcapsule sheet 21 to be used as the photosensitive recording medium is wound, a winding roller 23 for taking up the microcapsule sheet 21 after exposure and development, and a cassette 24 in which the supply roller 22 and the winding roller 23 are installed.

A bar code 25 is provided on the winding roller 23. The bar code 25 includes information about the optimum image forming conditions, such as the exposure and fixing, or developing, conditions which relate to the microcapsule sheet 21 stored on supply roller 22 for use in the image forming apparatus 10. The bar code 25 consists of a plurality of stripes which are parallel to the rotation axis of the winding roller 23. The photosensitive recording medium unit 20 is removably installed in the main body of the image forming apparatus 10 by means of the cassette 24. When the cassette 24 is installed in the image forming apparatus 10, the winding roller 23 is connected to a drive mechanism (not shown) and is driven by the drive mechanism. A recording medium such as disclosed in U.S. Pat. No. 4,399,209 may be used as the microcapsule sheet 21.

The image forming apparatus of the present invention includes an axis pressing member 26 which is inserted into the cassette 24 through an aperture 24a on the underside of the cassette 24 when the photosensitive recording medium unit 20 is installed in the main body of the image forming apparatus 10. To install cassette 24 in the image forming apparatus 10, original stand 31 is displaced, to the right as shown in FIG. 1, to permit the top cover 11 to be opened. Top cover 11 pivots around pivotal connection 12 to provide an opening through which cassette 24 can be inserted into image forming apparatus 10.

After installation of cassette 24, top cover 11 is closed and original stand 31 returned to its operating position. As a result, the axis pressing member 26 is pivotally supported by support member 13 in the cassette 24 and can pivot in the direction of an arrow A around a fulcrum 27. Provided on the axis pressing member 26 is a pressure roller 28, which initially rests on the surface of winding roller 23, and an optics type bar code reader 29 for reading the bar code 25 formed on the winding roller 23. The optics type bar code reader 29 faces the bar code 25 on the winding roller 23 and is kept a predetermined distance from the bar code 25 by the pressure roller 28 resting on the winding roller 23.

Support member 13 is attached in the frame of the image forming apparatus 10 by brace 18 to provide a mount for fulcrum 27. A spring 14, connected between support member 13 and latching arm 26E, provides a slight tension to maintain pressure roller 28 against the surface of winding roller 23. The latching arm 26E is an integral part of axis pressing member 26 extending from the fulcrum 27 in a direction away from the pressure roller 28. At a lower end of the latching arm 26E is a notch 16 that is engaged by latch 15 when the winding roller 23 has taken up the exposed roll of photosensitive recording medium 21. A manual or cassette 24 activated release mechanism 17 releases the latching arm 26E from latch 15 upon replacement of the used photosensitive recording medium unit 20 with a new unit.

The exposing device 30, for exposing the microcapsule sheet 21 based on the original, is provided in the vicinity of the photosensitive recording medium unit 20. The exposing device 30 comprises an original stand 31, on which the original is placed, and an optical device 32 which exposes the microcapsule sheet 21 based on the original. During the exposure operation the original stand 31 moves as indicated by arrow B. The optical device 32 comprises a light source 33, such as a halogen lamp, to irradiate the original, a filter 34, a lens 35, and reflectors 36, 36 to direct the light reflected from the original to an exposure stand 37.

The pressure developing device 40 is provided downstream, as defined by the feed direction of the microcapsule sheet 21, of the exposing device 30. In the pressure developing device 40, the exposed microcapsule sheet 21 and a developer sheet 82, supplied from the sheet cassette 81 by a sheet supplying device 80, are brought into face to face contact and are pressed together under pressure so that an image is developed on the developer sheet 82. Pressurizing rollers 40a and 40b, which oppose one other, are installed in the pressure developing device 40. The pressurizing rollers 40a and 40b apply the pressure to the developer sheet 82 and the exposed microcapsule sheet 21.

A separation device 50, for separating the microcapsule sheet 21 and the developer sheet 82 after development, is installed downstream of the pressure developing device 40.

A thermal fixing device 60, for fixing the image developed on the developer sheet 82 in the pressure developing device 40, is installed immediately after the separation device 50 along the direction of feed for the developer sheet 82. A heater and a fan (not shown) for applying heated air to the image forming side of the developer sheet 82 are installed in the thermal fixing device 60. The developer sheet 82 on which the image is fixed in the thermal fixing device 60 then passes to a discharge tray 70. Controlling the exposure and development processes affects the deepness level of colorization of the chromogenic materials as these processes determine the hardness of the capsules and their rupture and reaction with the developer respectively. U.S. Pat. No. 4,714,943 discloses an apparatus for varying the pressure to which the photosensitive recording medium and the developer sheet are subject during development.

The image forming apparatus 10 of the present invention also includes a controller (not shown in FIG. 1) which controls the exposing device 30 and the pressure developing device 40 based upon the information read from the bar code 25.

Figure 4:
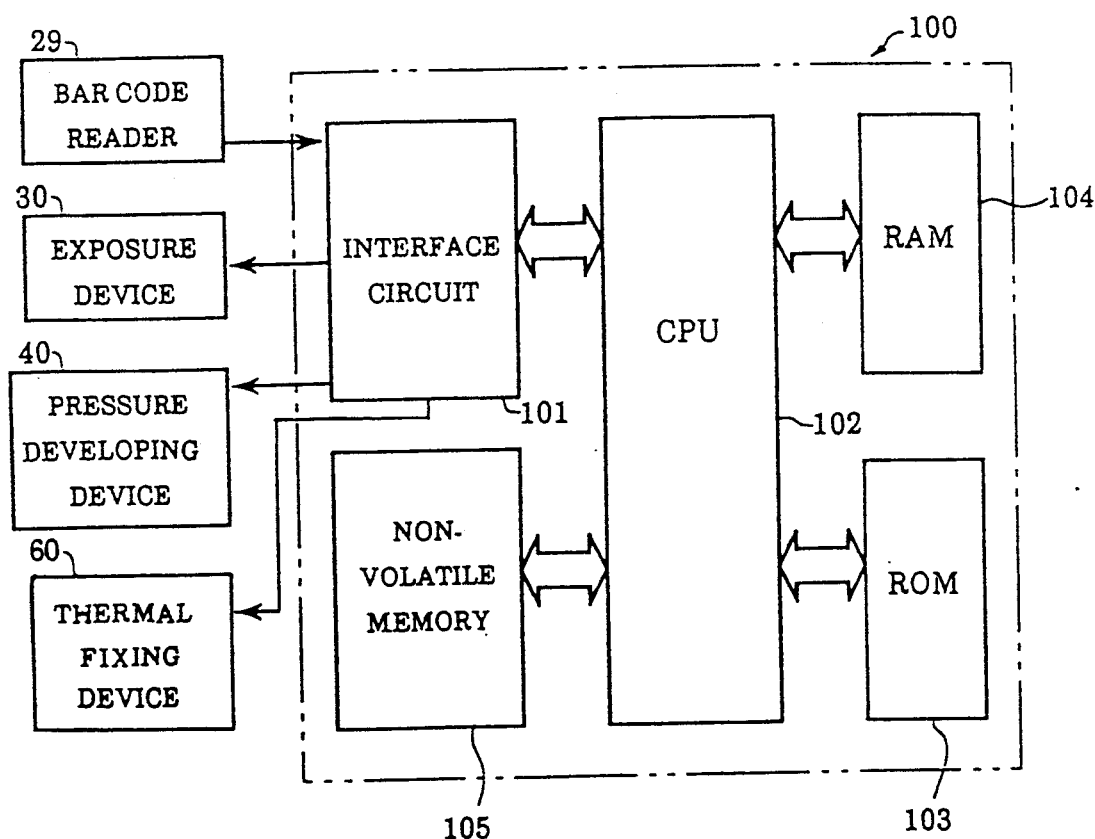
FIG. 4 is a schematic block diagram of the image forming apparatus.

The structure of the controller will be explained with reference to FIG. 4.

As shown, the optics type bar code reader 29, the exposing device 30, the pressure developing device 40, and the thermal fixing device 60 are connected to a CPU(Central Processing Unit) 102 through an interface circuit 101 in the controller 100. ROM(Read Only Memory) 103 is connected to CPU 102 and CPU 102 operates according to the program stored in ROM 103. Moreover, RAM(Random Access Memory) 104 and non-volatile memory 105 are connected to CPU 102. Even when the power supply of the image forming apparatus 10 is turned off, the data stored in non-volatile memory 105 is maintained.

Hereinafter, the operation of the image forming apparatus 10 of the present invention will be explained. First, the operation for reading information on characteristics of the microcapsule sheet 21 will be explained.

When the photosensitive recording medium unit 20 is installed in the image forming apparatus 10, the axis pressing member 26 enters the cassette 24 of the photosensitive recording medium unit 20 through the aperture 24a. At this time, the axis pressing member 26 is standing essentially vertically as notch 16 is engaged by latch 15. Subsequently, when the axis pressing member 26 is pivoted counterclockwise, the pressure roller 28 comes into contact with the winding roller 23 and the optics type bar code reader 29 faces, at a predetermined distance based on pressure roller 28, the bar code 25 formed on the surface of the winding roller 23. Next, the winding roller 23 starts rotating as part of an automatic feed of the microcapsule sheet 21. At this time, the bar code 25 formed on the winding roller 23 is read by the optics type bar code reader 29. Thus, when a new photosensitive recording medium unit 20 is installed and feed of the microcapsule sheet 21 commences, information on characteristics of the photosensitive recording medium 21 is read. Because the bar code 25 is formed on the surface of the winding roller 23 and always faces always the bar code reader 29 at the predetermined distance, information can be always be read, at the initiation of recording medium feed, at a constant focus by the bar code reader 29 thereby simplifying the bar code reader's structure which may be, for example, a reflection type photo-interrupter.

The information read by the optics type bar code reader 29 is sent to the controller 100. The controller 100 controls operation of the image forming apparatus based on the information read so that the exposure device 30 and the pressure developing device 40 are optimally driven based on the characteristics of microcapsule sheet 21. This information is stored in the non-volatile memory 105.

Further, as a result of the automatic feed of the microcapsule sheet 21, its leading portion is drawn from the cassette 24, passes the exposure stand 37, the pressure developing device 40, and the separation device 50 and returns again to the cassette 24 where it is wound up on the winding roller 23. Thus, the microcapsule sheet 21 is positioned so that an image can be reproduced.

Next, the image forming operation will be explained.

As shown in FIG. 3, the microcapsule sheet 21 wound on the supply roller 22 is transported in the direction of arrow C at a predetermined speed as the microcapsule sheet 21 is taken up by the winding roller 23. At the same time, the original stand 31, on which the original is placed, moves at the same speed as the microcapsule sheet 21 being transported. The optical device 32 irradiates the original with light that is reflected to the microcapsule sheet 21 passing across the exposure stand 37 to produce an exposure on the microcapsule sheet 21.

Concurrently, a developer sheet 82 is transported from the sheet cassette 81 to the pressure developing device 40 by the sheet supplying device 80, where the developer sheet is stopped for subsequent pairing with the exposure on the microcapsule sheet 21.

The microcapsule sheet 21, exposed by the exposure device 30, is transported to the pressure developing device 40 and the microcapsule side of the microcapsule sheet 21 and the developer sheet 82 are brought into overlapping face to face contact. The paired exposed microcapsule sheet 21 and the developer sheet 82 are nipped between the pressure rollers 40a and 40b under pressure so that the image is formed on the developer sheet 82.

The paired microcapsule sheet 21 and developer sheet 82 are transported to the separation device 50 where they are separated. The separated microcapsule sheet 21 is taken up by the winding roller 23 as the now separated developer sheet 82 is transported to the thermal fixing device 60 where the image developed on developer sheet 82 is fixed by heat. Then the developer sheet 82, on which the image is now fixed, is passed out to the discharge tray 70. Because the process of the image forming is executed based on information concerning the characteristics of the microcapsule sheet 21 read from the bar code 25, the image can be formed consistently.

Further, according to the present invention, because information read by the optics type bar code reader 29 is stored in the non-volatile memory 105, even when the power supply of the image forming device 10 is turned off, the information is retained in memory.

It should be understood that many changes and modifications may be made in the disclosed embodiment without departing from the scope of the present invention. For instance, other indicia than a bar code may be used for providing the characteristics of the microcapsule sheet 21, and other type readers than the optics type reader may be used the as reading means. Possible alternatives include a magnetic code and associated reader, an electronic contact code reader, and a mechanical contact reader.

According to the preferred embodiment, a cassette type photosensitive recording medium unit in which both the supply roller 22 and the winding roller 23 are installed is used. However, other structure may be used. For example, the paired supply roller, on which a microcapsule sheet is provided, and winding roller, having thereon the indicia providing information on the characteristics of the microcapsule sheet, can be removably mounted in a box or container permanently installed in the image forming apparatus. When such a paired supply roller and the winding roller are used, the operator replaces the paired supply roller and the winding roller in the box without replacing the box.

What is claimed is:

1. An image forming apparatus for forming an image using an elongated web-like recording medium, comprising:

a supply member detachably installed in said apparatus on which said recording medium is wound;

image forming means for forming the image on said recording medium supplied from said supply member;

a winding member detachably installed in said apparatus to take up said recording medium supplied from said supply member, wherein said winding member has information on specific characteristics of said recording medium;

reading means for reading said characteristics information; and control means for controlling said image forming means according to said characteristics information read by said reading means, wherein said information comprises a bar code and said reading means comprises an optics type reader.

2. An image forming apparatus as claimed in claim 1, wherein said winding member is a winding roller, and wherein a plurality of stripes of said bar code are in parallel with a rotation axis of said winding roller whereby said bar code is read by said optics type reader upon initiation of feed of said recording medium from said supply member through the apparatus to said winding roller.

3. An image forming apparatus as claimed in claim 1, further comprising a pressing member to press said winding member, wherein said reading means is provided on said pressing member facing and maintained a predetermined distance from said information so that a focus of said reading means is kept stable.

4. An image forming apparatus as claimed in claim 3, wherein said pressing member includes a pressing roller which contacts with said winding member to keep said predetermined distance.

5. An image forming apparatus for forming an image using an elongated web-like recording medium, comprising:

a supply member detachably installed in said apparatus on which said recording medium is wound;

image forming means for forming the image on said recording medium supplied from said supply member;

a winding member detachably installed in said apparatus to take up said recording medium supplied from said supply member, wherein said winding member has information on specific characteristics of said recording medium;

reading means for reading said characteristics information;

a pressing member to press said winding member, wherein said reading means is provided on said pressing member facing and maintained a predetermined distance from said information so that said reading means is kept stable relative to said information; and control means for controlling said image forming means according to said characteristics information read by said reading means.

6. An image forming apparatus as claimed in claim 5, further comprising a cassette detachably installed in said apparatus in which said supply member and said winding member are mounted, said cassette providing the detachable installation of said winding member and said supply member.

7. An image forming apparatus as claimed in claim 5, wherein said cassette has an aperture, said pressing member entering said cassette through said aperture when said cassette is installed in said apparatus.

8. An image forming apparatus for recording an image on an elongated web-like recording medium, comprising:

a storage container mounted in the image forming apparatus;

a supply member on which said recording medium is wound mounted in said storage container;

image forming means for forming an image on said recording medium supplied from said supply member;

a winding member mounted in said storage container, said winding member having therein indicia indicative of use characteristics for said recording medium;

reading means for reading said indicia; and control means for controlling said image forming means in accordance with said use characteristics, wherein said indicia is a bar code and said reading means comprises an axis pressing member mounting a bar code optical reader thereon, said axis pressing member being pivotally mounted to the image forming apparatus by means of a support member.

9. An image forming apparatus as claimed in claim 8, wherein said storage container is a replaceable cassette.

10. An image forming apparatus as claimed in claim 8, wherein said storage container is fixedly mounted in the apparatus and said supply member and said winding member are removably mounted in said storage container, said supply member and said winding member comprising a matched feed pair.

11. An image forming apparatus as claimed in claim 8, wherein said axis pressing member further comprises a pressing member mounted at an end opposite said pivotal mount, said pressing member resting on an outer surface of aid winding member prior to attachment of said recording medium to said winding member.

12. An image forming apparatus as claimed in claim 8, said support member comprising:

support means for attaching said support member to the image forming apparatus;

a latching arm as an integral part of said axis pressing member, said latching arm being opposite said bar code optical reader with respect to the pivotal mount of said axis pressing member, said latching arm having a notch at an end thereof;

a latch for engaging said notch; and release means for releasing said notch from said latch so that said axis pressing member is capable of pivotal movement.

13. An image forming apparatus for recording an image using an elongated web-like recording medium, comprising:

a supply member detachably installed in said apparatus on which said recording medium is wound;

imaging forming means for forming an image on said recording medium supplied from said supply member;

a winding member detachably installed in said apparatus and rotatable to take up said recording medium supplied from said supply member, said winding member being provided with a circumferential surface having information on specific characteristics of said recording medium;

reading means for reading said characteristics information, said reading means being disposed in said apparatus to be movable relative to said winding member in a radial direction of said winding member;

maintaining means for maintaining said reading means at a predetermined distance from said circumferential surface so that a focus of said reading means is kept stable; and control means for controlling said image forming means according to said characteristics information read by said reading means.

14. An image forming apparatus as claimed in claim 13, wherein said reading means comprises an optics type reader, and said maintaining means maintains said reading means so that the focus of said reading means is kept stable.

15. An image forming apparatus as claimed in claim 13, wherein said maintaining means comprises a support member pivotally mounted in said apparatus for supporting said reading means and a contact roller provided on said support member for contacting with said circumferential surface.

16. An image forming apparatus as claimed in claim 13, wherein said image forming means includes an exposure device for exposing said recording medium to a light image and a pressure developing device for pressurizing said exposed recording medium to form a visible image, said characteristic information comprising exposure information and developing information about an optimum exposure condition and an optimum developing condition, and said control means controls said exposure device and pressure developing device according to said exposure and developing information.

* * * * *